United States Patent
Wojnarowski et al.

[11] Patent Number: 5,108,825
[45] Date of Patent: Apr. 28, 1992

[54] EPOXY/POLYIMIDE COPOLYMER BLEND DIELECTRIC AND LAYERED CIRCUITS INCORPORATING IT

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 646,112

[22] Filed: Jan. 28, 1991

Related U.S. Application Data

[62] Division of Ser. No. 454,545, Dec. 21, 1989.

[51] Int. Cl.⁵ .............................................. B32B 9/00
[52] U.S. Cl. ................................... 428/209; 428/413; 428/473.5; 428/901
[58] Field of Search ..................... 428/901, 209, 473.5, 428/413

[56] References Cited

U.S. PATENT DOCUMENTS

| | | |
|---|---|---|
| 3,856,752 | 12/1974 | Bateman et al. |
| 4,480,009 | 10/1984 | Berger |
| 4,557,860 | 12/1985 | DiSalvo et al. |
| 4,692,272 | 9/1987 | Gaswami et al. |
| 4,783,695 | 11/1988 | Eichelberger et al. ............... 357/65 |
| 4,824,716 | 4/1989 | Yerman ................... 428/209 |
| 4,931,539 | 6/1990 | Hayes |

FOREIGN PATENT DOCUMENTS 00099338 1/1984 European Pat. Off.

OTHER PUBLICATIONS

Lee and Neville, *Handbook of Epoxy Resins*, McGraw-Hill Book Company, New York (1967), pp. 11:11-12.

*Primary Examiner*—Patrick J. Ryan
*Assistant Examiner*—Kam F. Lee
*Attorney, Agent, or Firm*—William H. Pittman; James C. Davis, Jr.

[57] ABSTRACT

A copolymer blend of epoxy and polyimide is used as a dielectric layer in a multilayer interconnect structure. This copolymer blend is free of cracking and crazing, provides good interlayer adhesion and following fabrication, is stable at temperatures in excess of 200° C. A preferred composition is a siloxane polyimide in combination with a cycloalaphatic epoxy.

4 Claims, 2 Drawing Sheets

EPOXY/POLYIMIDE COPOLYMER BLEND DIELECTRIC AND LAYERED CIRCUITS INCORPORATING IT

This application is a division of application Ser. No. 07/454,545 filed Dec. 21, 1989, now abandoned.

BACKGROUND OF THE INVENTION

1. Field of the Invention

The present invention relates to the field of dielectric materials, and more particularly, to the field of dielectric materials particularly suitable for use in the formation of multilayer conductor structures.

2. Background Information

A high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sept. 27, 1989, entitled "Method and Apparatus for Removing Components Bonded to a Substrate" by R. J. Wojnarowski, et al ; U.S. patent application Ser. No 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sept. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 3,020,filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuit and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application 289,944, filed Dec. 27, 1988, entitled "Selective Electrolytic Deposition on Conductive and Non-Conductive Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; and U.S. patent application Ser. No. 363,646, filed Jun. 8, 1989, entitled "Integrated Circuit Packaging Configuration for Rapid Customized Design and Unique Test Capability" by C. W. Eichelberger, et al. Each of these Patents and Patent Applications is incorporated herein by reference. Each of the above patents is incorporated herein by reference.

Briefly, in this HDI system, integrated circuits or other electronic devices are attached to a substrate with their connection pads exposed. A dielectric layer of KAPTON ® polyimide available from E. I. DuPont de Nemours is laminated over the electronic chips and substrate using, as a thermoplastic adhesive, a layer of ULTEM ® polyetherimide resin available from General Electric Company, via holes are drilled in this composite dielectric layer in alignment with each connection pad to which it is desired to have the first layer of metallization of the HDI structure connect, the first metallization layer is deposited and patterned (if not deposited in a patterned manner) and further dielectric layers and metallization layers are applied over the initial metallization layer, if needed, until the structure is complete.

This structure places special requirements on the dielectric materials. In particular, in order for the final structure to be usable over a wide temperature range, the dielectric layers must have high melting points and high thermal stability. They must also be laser ablatable by ultraviolet light in order to form the via holes through which different layers of metallization are connected. In the HDI system, laser processing (ablation, photoresist exposure, etc.) is normally done with one, or at most, two passes of the laser beam with a power ranging from 0.5 to 2.0 watts with a preferred maximum power level being about 1.5 watts. Thus, when a dielectric layer is characterized as being laser ablatable, it means that such a layer can be totally removed by one or two passes of a laser beam of this power level and when it is characterized as not being laser ablatable, it means that a layer is not completely removed by one or two passes of such a laser beam.

To minimize the complexity and cost of equipment for fabricating such high density interconnect structures, it is considered desired to be able to do all laser processing at a single frequency in order that only a single laser is required. Accordingly, preferred materials are those which may be processed at a laser frequency of 351 nm. This frequency was selected in accordance with the characteristics of desirable dielectric layers such as Kapton ® polyimide available from E. I. DuPont de Nemours and the fact that there are commercial photoresists which can be processed at this frequency. ULTEM ® polyetherimide resin available from General Electric Company has been used as an adhesive layer in this high density interconnect structure for bonding Kapton ® to the underlying structures. The ULTEM ® resin is laser ablatable at 351 nm.

The ULTEM ® material has a melting point in the neighborhood of 217° C. or higher, depending on its specific formulation. This ULTEM ® high temperature adhesive layer is suitable for use in permanent structures.

In those metallization layers in which signal conductors (as opposed to ground or power plane layers) run, a significant portion of the area contacted by the next dielectric layer comprises the preceding dielectric layer on which that metallization layer is disposed.

One of the important features of this HDI structure is its repairability. This structure may be repaired by heating the structure to the melting or softening point of the thermoplastic ULTEM ® resin layer which serves as the adhesive portion of the first dielectric layer. The entire HDI overlay structure may then be peeled off the substrate and the integrated circuit chips without damage to the chips or their connection pads. Thereafter, a defective chip may be removed and replaced. A new HDI overlay structure is then formed on the substrate and chips. In this manner, faulty chips may be replaced and errors such as unintentional shorts and open circuits in the HDI metallization structure may be repaired without damage to good electronic chips. This makes this HDI structure feasible for use with circuits including many expensive chips since a faulty chip or an error in circuit connection does not render the other, good chips in the structure unusable.

It is important for this repairability that the upper dielectric layers not bond to the metallization in the via holes of the first dielectric layer in a manner which results in tearing of contact pads on the chips during removal of the HDI overlay layer. Consequently, it is considered necessary to avoid the presence of thermoset materials in the via holes in the first dielectric layer. In this application, when we say "thermoplastic", we mean a material which when repeatedly heated and cooled, retains substantially the same softening temperature with the result that the layer may be heated in order to render it fluid and removable. When we say "thermoset", we mean a material which on reheating, remains solid at a substantially higher temperature than the temperature at which it was initially liquid or fluid. This change in softening temperature is generally a result of cross-linking within the polymer of which the layer is formed in a manner which creates a new structure having a substantially higher melting temperature or which no longer melts.

Thermoset materials which are thermoset at high temperatures such as 250° C.–350° C. are generally considered unsuitable for use in the HDI structure where an ULTEM ® resin is used as the adhesive layer for the initial Kapton ® layer because the ULTEM ® softens at a temperature in the vicinity of 217° C. (ULTEM ® 1000) or 236° C. (ULTEM ® 6000). Further, since most such thermoset materials cross-link by condensation, unacceptable quantities of water become trapped within dielectric layers. This results in detrimental effects on the underlying electronic chips, on the included metallization and/or in undesirable effects upon heating above 100° C. where the water vaporizes and causes separation of different dielectric layers.

Epoxies, although they cure by non-condensation reactions, have been considered unacceptable as the later dielectric layers because of their rigid, brittle nature which makes safe removal of HDI overlayers for repair difficult and because of generally poor adhesion between successive epoxy layers.

A problem which has been encountered in forming multilayer HDI structures is the tendency of thermoset materials to not adhere well to an underlying thermoset layer of the same material because of a lack of linking between the two layers as a result of the first layer having been fully cross-linked prior to application of the second layer. With thermoplastic materials, the solvents used for applying subsequent layers normally partially redissolve the preceding layers, thereby providing good adhesion, but often resulting in an attendant cracking or crazing of the layers as a result of uneven stresses. As has been set forth in some of the above-identified patents and applications, a siloxane polyimide available under the trade names SPI-129 and SPI-135 from Huls America, which is formulated with a diglyme solvent does not result in cracking and crazing of an underlying ULTEM ® adhesive layer. This makes SPI-129 a suitable material as the dielectric layer which overlies the first dielectric layer and fills the via holes in the first dielectric layer since there are no adverse reactions between the SPI-129 and the underlying Kapton ® and ULTEM ® layers and because this is a thermoplastic material, having a softening point in the vicinity of 100°–150° C. Unfortunately, difficulty has been encountered in using the SPI-129 as the sole dielectric material for subsequent layers of the multilayer structure because of the tendency of the initial SPI-129 layers to soften during application of subsequent layers with a resulting shifting of the conductors disposed thereon in combination with solvent crazing effects.

Use of additional thermoset material/thermoplastic adhesive layer films (similar to the initial Kapton ® /ULTEM ® dielectric layer) laminated over underlying HDI layers has been found to be unacceptable because of a tendency of the metallization in those underlayers to shift as a result of the lamination pressure used to bond the subsequent layer to the underlying layers.

While the high density interconnect (HDI) structure which is disclosed in the above-identified patents and applications may be fabricated with a single layer of metallization, there are many systems which are suitable for fabrication in the HDI structure which require multiple layers of metallization in order to properly interconnect all of the electronic components of the system. Consequently, there is a need for dielectric materials which may be processed to form multiple layers of dielectric interleaved with metallization layers in a manner which produces a reliable, high quality interconnect structure which is free of crazing, cracking and other visible problems in the dielectric material and metallization layers.

A number of materials and processes are available to the industry for providing dielectric layers in multilayer structures such as multilayer printed circuit boards. However, we have found that these materials are unsuitable for HDI use for a number of reasons. First, many require curing at greater than 250° C. and preferably in excess of 350° C. for from 1 to 3 hours in order for imidization to take place. Many of these materials suffer from shrinkage with the result that they apply undue stress on the substrate to which they are applied, and in many cases, can even warp silicon wafers into a cup having a depth of as much as 40 mils (0.102 mm) for a 4 inch (10.16 cm) diameter wafer. Further, if each layer is fully cured prior to application of the next layer, interlayer adhesion is poor and delamination often results. Attempts to process these materials without fully curing each layer before application of the next layer leads to cracking and crazing in the second or higher layers.

Solvent crazing is a recognized problem in forming multiple layers of a particular polymeric material. This is due, at least in part, to the solvent partially redissolving the upper surface of the preceding layer. Many processing steps carried out in the HDI process such as sputtering, reactive ion etching, ion milling and so forth, further sensitize the surfaces of such layers in a manner which aggravates the cracking and crazing problems. Other available materials are not laser drillable at 351 nm, provide too thin a dielectric layer or are processed at too high a temperature. A further problem is that amine cures are not acceptable in structures having aluminum metallization because of the adverse effects on that metallization. Epoxies, being thermoset materials, are difficult to use, while polyesters, acrylics and urethanes are unacceptable because of various failure modes and their general inability to remain stable at temperatures in excess of 125° C.

While this discussion has focused on the General Electric Company's High Density Interconnect (HDI) structure, those skilled in the art will recognize that many of these same problems are present in the multilayer printed circuit board art. There are solutions to a number of these problems in the multilayer printed circuit board art. However, these solutions are inapplicable to the HDI structure because the printed circuit board art involves the use of temperatures which are high enough themselves or which are high enough in combination with the period of exposure that unacceptable degradation of components of the HDI structure would result. These components of the HDI structure may be the integrated circuits which are being interconnected thereby other materials used in the HDI structure. Still other printed circuit board solutions to these problems are inapplicable to HDI because they would render the HDI structure unrepairable.

There is a need for a dielectric composition and structure which allows multiple dielectric layers to be stacked without a tendency for the metallizations to shift, without a decrease in the maximum operating temperature of the structure and without cracking or crazing of any of the dielectric layers.

OBJECTS OF THE INVENTION

Accordingly, a primary object of the present invention is to provide a dielectric material having the characteristics necessary for use as the subsequent dielectric layers of a multilayer interconnect structure.

Another object of the present invention is to provide a method of forming successive dielectric layers which avoids the problems of poor adhesion, cracking, crazing and lower layer deformation which are exhibited by many prior art materials in an HDI structure.

Another object of the present invention is to provide a dielectric material which is a copolymer blend of crosslinkable epoxies and polyimides which has the necessary characteristics for use as successive dielectric layers in an HDI structure.

Another object of the present invention is to provide a source solution in the form of a copolymer blend of epoxies and polyimides which is suitable for the formation of conformal dielectric overlayers on a wide variety of substrates and structures.

Still another object of the present invention is to provide a solid dielectric layer which is a copolymer blend of a crosslinked epoxy and a polyimide.

A further object of the present invention is to provide a method of forming dielectric layers in which a copolymer blend of a crosslinkable epoxy and a substantially reacted (including fully reacted) polyimide is coated onto a substrate, any solvent is removed and the epoxy is cured to form a thermoset layer which is more flexible and less brittle than a pure epoxy.

A still further object of the present invention is to provide a dielectric which is a epoxy/polyimide copolymer blend and is stable to a higher temperature than the lower temperature material of the epoxy and the polyimide.

SUMMARY OF THE INVENTION

The above and other objects which will become apparent from the specification as a whole, including the drawings, are accomplished in accordance with the present invention through provision of a dielectric layer which is a copolymer blend of an epoxy or epoxies and a polyimide or polyimides. Such a dielectric layer may be formed using a source solution of the polyimide dissolved in a solvent and mixed with the liquid epoxy and a curing agent for the epoxy. This copolymer blend is then coated on a substrate, heated to remove the solvent and further heated to cure the epoxy to thereby form a thermoset dielectric layer. An epoxy/curing agent combination is preferably used which has an elevated threshold temperature below which curing does not occur.

Alternatively, the polyimide may be dissolved directly in the epoxy, without the use of a separate solvent in which case a copolymer blend of the epoxy and the polyimide along with a curing agent for the epoxy comprises the source solution. With such a solventless source solution, no removal of solvent is needed prior to curing of the epoxy. A mixture of two epoxies, one having a relatively high viscosity and the other having a relatively low viscosity may be used to provide a source solution which is more easily disposed in thin layers. Alternatively, an epoxy and a reactive diluent may be used to dissolve the polyimide in a solventless process. Any compatiable low molecular weight epoxide may be used as the diluent. Compatiability can be easily determined by mixing a some batch of the source solution with a potential diluent and coating it on a test substrate, curing it and check for obvious degradation. Some suitable diluents are butylglycidylether (BGE), ERL 4206, phenylglycidylether and similar materials and their equivalents.

The ratio of polyimide solids to epoxy solids may be varied over a wide range with the final characteristics of the dielectric material depending on the ratio of polyimide and epoxy solids in the final product.

In an HDI structure, a thermoplastic layer such as SPI-129 is preferably disposed over the initial Kapton ® layer and in the via holes in the Kapton ® layer (after the Kapton has been properly prepared for adequate adhesion by surface cleaning or roughening) prior to application of the first epoxy/polyimide copolymer blend layer to the HDI structure in order to ensure the ability to non-destructively remove the overlay structure from the underlying electronic chips.

This dielectric epoxy/polyimide copolymer blend is also useful as the binder in glass/dielectric printed circuit boards and has still wider applicability as a conformal dielectric coating.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
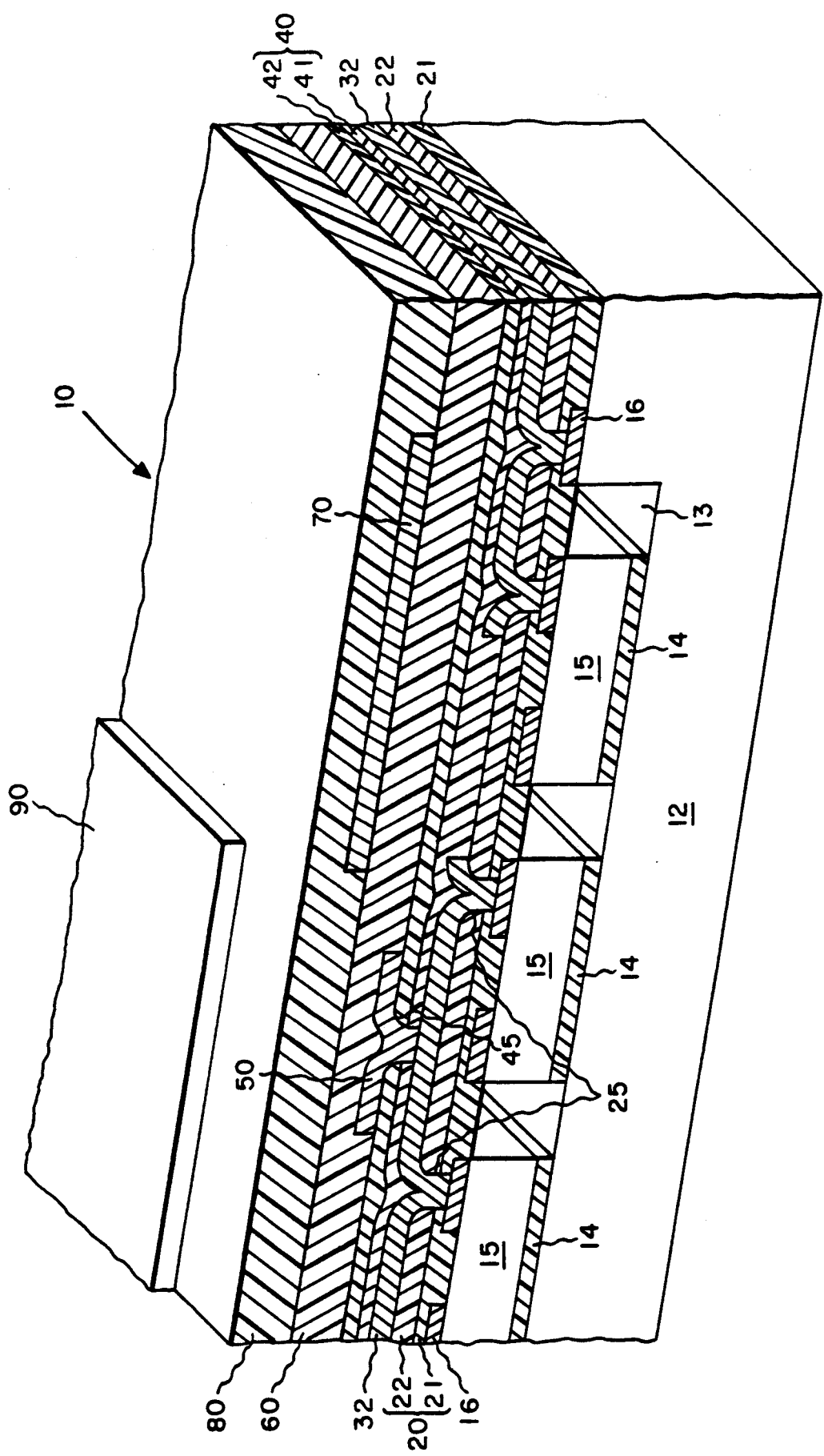
FIG. 1 illustrates a multilayer HDI structure in accordance with the present invention.

A high density interconnect (HDI) structure in accordance with the present invention is illustrated in perspective cutaway view at 10 in FIG. 1. This structure comprises a substrate 12 having a plurality of electronic chips 15 disposed in a cavity 13 in the upper surface thereof. Each of the chips 15 is preferably glued to the bottom of the cavity 13 by a thermoplastic adhesive layer 14 which may preferably be ULTEM 6000 ® resin available from General Electric Company. Each of the chips 15 has a plurality of contact pads 16 disposed on the upper surface thereof. These contact pads, as is well known in the art, are provided for making external electrical connections to the individual chips. A first dielectric layer 20 is bonded to the upper surface of the substrate 12 and to the upper surface of each of the chips 15 and the contact pads 16 thereon. The dielectric layer 20 preferably comprises a Kapton ® polyimide layer available from E. I. Du Pont de Nemours and an adhesive layer 21 of ULTEM 1000 ® polyetherimide resin available from General Electric Company. The dielectric layer 20 has a plurality of vias 25 drilled therein to facilitate external connection to the individual contact pads 16. A layer of metallization 30 is disposed on the upper surface of the dielectric layer 20 and comprises individual conductors 32, at least some of which extend into the via holes 25 to make ohmic electrical contact to selected contact pads 16. It is preferred that every contact pad to which an external connection will be made is provided with a connection to the first layer 30 of metallization in order to ensure repairability of the overall structure. The metallization layer 30 may be deposited in a patterned manner as the plurality of conductors 32 or may be deposited or otherwise formed as a single, continuous layer of metallization which is subsequently patterned through use of photoresist and etching or other techniques. It is preferred to inspect the metallization pattern 30 prior to application of the next dielectric layer since repair of the conductor pattern 30 prior to application of the next dielectric layer may be performed without removing the entire overlay structure. Subsequent to application of the following dielectric layer, it is generally necessary to remove the entire overlay structure and start over if an error is found in a metallization pattern.

The next dielectric layer 40 also comprises two different materials. It comprises a first portion or layer 41 of a preferably thermoplastic material such as a siloxane polyimide which may preferably be SPI-129 available from Huls America of Phoenix, Arizona. This layer is preferably formed by spin coating or spraying on the liquid SPI which is then baked to remove the solvent to leave the solid layer 41.

Thereafter, a second portion 42 of the dielectric layer 40 is formed on top of the portion 41. The portion 42 is preferably formed by spin coating or spraying a copolymer blend of a polyimide and a crosslinkable epoxy. The polyimide of this copolymer blend may preferably be a siloxane polyimide which is fully reacted, such as siloxane polyimide SPI-129 or SPI-135. The crosslinkable epoxy of this copolymer blend may preferably be a cycloalaphatic epoxy such as CiBA Geigy ® CY179 (electronic grade) or Union Carbide ® ERL 4221 (electronic grade). Other epoxies may also be used. A copolymer blend of these source materials is formed to which a suitable curing agent for the epoxy is added, if needed. This material is then spin or spray coated on the layer 41 in the process of forming the layer 42.

Suitable curing agents for these epoxies include Lewis acids, including triflic acids, various metal cation salt curing agents, diphenyliodoniumhexafluoroantimonate, organic titanates, and many others known in the art and the equivalents of any of them. All of these curing agents may be provided in the form of an acid salt. Such curing agents which are commercially available include General Electric's Octacat ®, 3M's Fc520, 3M ID 98-0211-0837-2 available from 3M of St. Paul, Minn., or $BF_3$ gas (poisonous) and so forth and equivalents thereof. These specific curing agents are considered desirable because they exhibit a temperature threshold effect which allows heat to be applied to the layer to drive off the solvent without beginning the curing process. This temperature threshold effect is a result of the fact that these materials do not release the curing agent species which they contain until their specifc temperature threshold is reached or, in some cases, until they are exposed to ultravilaet light. We have found that UV curing of this material is not satisfactory because the UV light can not penetrate the epoxy/polyimide copolymer blend material to a sufficient depth to effect a cure because its polyimide component strongly absorbs UV light. A preferred concentration for these curing agents is in the range of from 0.4 to 6 parts per million.

Following application of this liquid layer, this epoxy/polyimide copolymer blend layer is dried by heating the structure to drive off any solvent. During this drying or solvent removal process the structure is kept at a temperature below the trigger temperature of the epxoy curing agent to ensure that all of the solvent is removed prior to curing the epoxy. This solvent removal temperature is preferably about 125° C. when the epoxy curing trigger temperature is in the vicinity of 150° C.

Each of the layers of the epoxy/polyimide copolymer blend material is preferably applied as two separate sub-layers in order to minimize the risk of pin holes and other imperfections in the layer of epoxy/polyimide copolymer blend 25 material The first sub-layer is preferably spun or sprayed on and dried to remove the solvent. Then, the second sub-layer is spun or sprayed on and dried to remove the solvent. All without allowing the structure to reach the curing temperature of the epoxy/curing agent combination.

At this stage two different processing sequences may be pursued. These result in different physical structures which are substantially equivalent electrically.

In the first of these processing sequences, the successive layers of the HDI structure are applied, patterned and processed using the epoxy/polyimide copolymer blend as the subsequent dielectric layers without heating the structure to the epoxy curing temperature. Good interlayer adhesion among the epoxy/polyimide copolymer blend layers results. Once the structure is complete, the structure is heated to above the trigger temperature of the epoxy curing agent to cure the epoxy in all of the layers at the same time. We have made multilayer structures including as many as 12 epoxy/polyimide copolymer blend layers in this manner which exhibited no cracking or crazing and in which there was substantially no shrinkage. This process sequence results in the structure 10 shown in FIG. 1.

Figure 2:
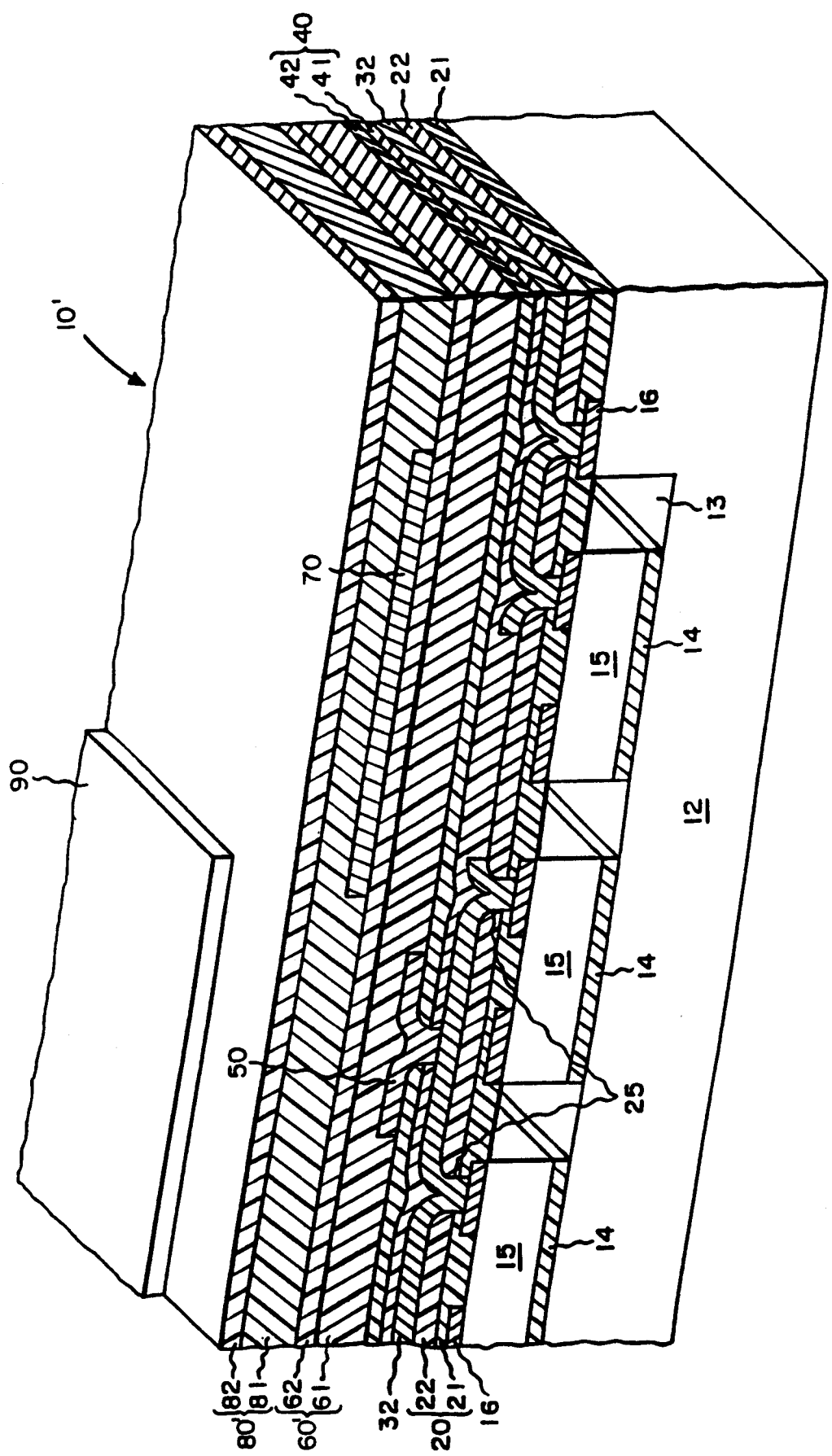
FIG. 2 illustrates a multilayer HDI structure in accordance with an alternative embodiment of the present invention.

In the second processing sequence, the structure is heated to above the epoxy curing agent trigger temperature (preferably in the 150° C.-200° C. range) after all solvent has been removed from the first epoxy/polyimide copolymer blend layer 42 to cure the epoxy. Once the epoxy has cured, the dielectric layer 40 is a thermoset layer which is resistant to cracking and crazing, but which does not provide good adhesion for a directly applied subsequent epoxy/polyimide copolymer blend layer. Consquently, another SPI-129 layer 61 (FIG. 2) should be applied over the first epoxy/polyimide copolymer blend layer 42 and any metal (50) thereon prior to applying the next epoxy/polyimide copolymer blend layer 62 in the manner which has been described. Multilayer structures of this type having as many as 12 layers of the epoxy/polyimide copolymer blend have also been fabricated without cracking, crazing or significant shrinkage. This process sequence results in the structure 10' shown in FIG. 2. Structure 10' in FIG. 2 is similar to the structure 10 in FIG. 1 except that each of the dielectric layers 60' and 80' in structure 10' comprises two different sub-layers having different compositions. The sub-layers 61 and 81 are thermoplastic and may preferably be SPI-129. The sub-layers 62 and 82 are thermoset epoxy/polyimide copolymer blend layers.

Following drying (or curing, depending of the process sequence being followed) of the layer 40, via holes 45 are drilled therein in the manner taught in the above-identified patents. Whether the epoxy has been cured or not has no significant effect on this drilling process. An additional metallization layer 50 comprised of individual conductors 52 is formed on top of the dielectric layer 40 and extends into the vias 45 in the dielectric layer 40 into ohmic contact with individual conductors 32 of the first metallization layer 30. Once again, the layer 50 may be deposited in a patterned manner or patterned after deposition.

Following patterning of the metallization layer 50, an additional dielectric layer 60 is formed thereover. The dielectric layer 60 is preferably an epoxy/polyimide copolymer blend which may have the same or a different composition than the portion 42 of the layer 40. If the epoxy in layer 42 is not cured before application of the epoxy/polyimide copolymer blend layer 60,then there is no need for the use of a thermoplastic separation layer between the upper portion 42 of the layer 40 and the layer 60. This is because (1), the thermoplastic layer 41 will serve as a separation layer (which protects the contact pads 16 by melting to ensure that no force is applied to the contact pads by the dielectric) in the event that it is necessary to remove the overlay layer from the structure to repair a faulty electronic chip 15 or a fault in one of the metallization patterns and (2) the subsequent epoxy/polyimide copolymer blend layers each have good adherence to the underlying layer so long as the epoxy in tha adjacent lower layer has no been cured prior to formation of the the layer in ques tion, since the layer 60 adheres well to the layer 42, sc long as the layer 42 has not been baked in a manner tc provide substantial molecular chain building cross-link ing among the epoxy molecules. Such prior cross-link ing would have the effect of decreasing the adhesion o a subsequent epoxy/polyimide copolymer blend to the underlying structure. The layer 60 is then dried in a manner similar to that in which the portion 42 of the layer 40 was dried, via holes are drilled in the layer 60 and a subsequent metallization layer 70 may be formed thereover. In a similar manner, an additional dielectric layer 80 of the epoxy/polyimide copolymer blend may be formed over the dielectric layer 60 in the metallization layer 70. A metallization layer 90 may be formed on top of the dielectric layer 80, if desired, and so on.

The above-described processing of this HDI structure through the patterning of the metallization layer 30 is preferably done in accordance with the methods taught in the above-identified patents. The polyimide layer 41, as has been mentioned, is preferably SPI-129 or a similar polyimide siloxane material such as M&T Chem ® of N.J. Product 2064 or any other similar material. SPI-129 is a diglyme solvent solution of siloxane polyimide containing 29% solids. SPI-135 is a similar material containing 35% solids. These materials may preferably be applied by spray or spin coating, after which they are preferably dried by baking at approximately 100° C. for 10 minutes, 150° C. for 20 minutes and 210° C. for 20 minutes. It is desirable to closely control the 210° C. temperature in order to ensure that the softening point of the ULTEM ® 1000 layer 21 (217° C.) is not reached or exceeded. This baking cycle removes substantially all of the diglyme solvent from this material leaving just the solid siloxane polyimide. The siloxane polyimide of SPI-129 is a fully reacted material as received from the supplier. Therefore, no imidization is involved in the baking cycle. Thus, no condensation reaction takes place and no water vapor is formed or entrapped within the dielectric layer. However, a polyimide which is substantially but not fully reacted may be used providing that it can be fully reacted at a low enough temperature thatepoxy degradation during the final curing does not become a problem. In this specification and in the appended claims, the term "substantially reacted" is used to include both materials which are fully reacted and those which are mostly reacted, but not fully reacted whose reaction can be completed at a low enough temperature that no adverse effects are produced in the sttructure in which it is being used.

The high density interconnect structure is then heated to drive off the solvent from the epoxy/polyimide copolymer blend. This heating must be to a low enough temperature that the trigger temperature of the epoxy curing agent is not reached in order that all of the solvent can be driven off before any curing of the epoxy takes place.

Once sufficient solvent has been removed from the epoxy/polyimide copolymer blend layer, the temperature can be increased to effect curing of the epoxy and the conversion of the layer 42 into a thermoset material.

The resulting epoxy/polyimide copolymer blend dielectric layer is laser drillable at 351 nm in a manner similar to that in which Kapton ® and ULTEM ® are drillable with the result that this material fits well into the established HDI process. In the HDI process, after laser drilling via holes, it is preferred to plasma etch the exposed surface of the high density interconnect structure in a $CF_4$ or $CF_4 + O_2$ plasma to remove any organic debris in the bottom or along the sides of the via holes.

As has been discussed in U.S. patent application Ser. No. 342,153, filed Apr. 24, 1989, entitled "Method of Processing Siloxane-Polyimides for Electronic Packaging Applications" by H. S. Cole, et al., we have found that this plasma etching step forms a layer on the surface of the siloxane polyimide which causes crazing, cracking and poor adhesion on the next dielectric layer. As explained in application Ser. No. 342,153, we have found that dippping the high density interconnect structure in an etchant for silicon oxide removes this layer and results in good adhesion for subsequent dielectric layers. This same type of cleaning is needed with this epoxy/polyimide copolymer blend after it is exposed to plasma etching with a fluorinated plasma.

A further advantage of this material is the fact that it can be cured at a maximum temperature in the range from $\approx 200°-210°$ C. to get maximum hardness and yet provides the properties of thermoset imide materials which must be processed at greater than 350° C.

Further, this material has a low dielectric constant (3.3–3.9) and has very low shrinkage. This low shrinkage is a substantial advantage over prior art coating materials which tend to shrink during processing and apply stress to the substrate on which they are applied.

EXAMPLE 1

A source solution for the layer 42 was formed by combining:
200 grams of CY179 epoxy
2 drops of copper napthanate in oil by Mooney Chemical, Inc., of Cleveland, Ohio (which is used as an accelerator at approximately 0.1 ppm)
2 grams Octacat ($\sim 1\%$ of epoxy solids)
472.38 gram SPI-135 @ 35% solids/65% solvents
to provide an overall solution in which the weight ratio of the polyimide solids to the epoxy solids was substantially 45.2%.

EXAMPLE 2

A similar source solution was formed from:
200 grams ERL 4221 epoxy from Union Carbide (not electronic grade)
2 grams Octacat
200 grams SPI-135
to provide a solution having a polyimide to epoxy solids weight ratio of substantially 26%. It will be noted that in this source solution, no copper napthanate is included. This is because the ERL 4221 was not electronic grade and thus contains enough initiation ions for the Octacat to provide a rapid cure of the epoxy without the presence of a separately added accelerator.

Each of these source solutions was spin coated on a separate test substrate to a desired thickness then baked at 125° C. for 20 minutes, 150° C. for 10 minutes and then recoated to build thicker layers, again being baked at 125° C. and 150° C. in order to remove solvent. When the desired thickness of 8 to 12 microns had been obtained, the structure was baked at 200° C. for 20-30 minutes, depending on the thickness. This high temperature bake resulted in substantial hardening of the overall dielectric layer. Additional layers of the Example 1 solution may be formed directly on such a structure with good adhesion. However, additional layers of the Example 2 solution are felt to provide inadequate adhesion after this high temperature bake without an intermediate layer of say 1-3 microns thick SPI-129 to assure good interlayer adhesion. This difference is felt to be a result of the difference in polymer/epoxy solids weight ratios.

Using these materials, materials which were baked at 150° C. have been re-coated with the epoxy/polyimide copolymer blend material, re-baked at 150° C. and re-coated to form a multilayer dielectric including more than 12 individually applied layers with no cracks, crazes or adhesion problems.

It should be noted that in stacking successive coats of either the Example 1 or Example 2 material, an acceleration effect is present. That is, the first coat baked at 120°C.-150° C. takes about 20 minutes to cure to a pencil hardness in the range of 3–4. However, the second coat cures 2–4 times as fast as a result of the presence of the underlying layer. Consequently, less curing agent or less accelerator can be used in the source solution for the second and subsequent coats to slow this curing time to ensure that solvent removal is complete prior to curing of the epoxy.

SPI itself is stable to more than 350° C., while the epoxy by itself decomposes rapidly at 200° C. The epoxy/polyimide copolymer blend is highly stable at 200° C., having exhibited no change in 5 hours at 200° C. Thus, this epoxy/polyimide copolymer blend is a higher temperature stablized material comprising the lower temperature epoxy. Thus, this material has properties which are derived from both source materials. This material stacks without crazing or cracking and is stable at 200° C. The epoxies used in the fabrication of typical printed circuit boards turn brown upon exposure to temperatures of 150° C. for a week. Consequently, this epoxy/polyimide copolymer blend material is superior for use in the fabrication of high temperature printed circuit boards and is a highly desirable dielectric material for the dielectric layers of an HDI, multilayer circuit board or other multilayer interconnect structure.

While in both Examples 1 and 2, the siloxane polyimide was included in the source solution in the form of a solvent solution, that is not necessary. A solventless system may also be used.

EXAMPLE 3

Source solutions were formed from solid SPI polymer by dissolving it in anyone of CY-179, ERL 4221 and ERL 4206, also available from Union Carbide. Each of these source solutions is solventless and thus, relaxes the requirements for baking successive layers since solvent removal is not a consideration.

The solid polymer SPI used in the above example was obtained from Huls America as a solid which was then dissolved in the epoxy.

While in Examples 1-3 only a single epoxy and only a single polyimide are employed in the copolymer blend, there are a number of situations where the use of more than one epoxy or polyimide is desirable. In particular, a high viscosity and a low viscosity epoxy may be mixed and used either with solid siloxane polyimide or with the diglyme or other solvent solutions of the siloxane polyimide.

EXAMPLE 4

A source solution was formed from:
75 grams of CY179 epoxy 15 grams of SPI-100 siloxane polyimide solids,
30 grams of ERL-4206 as a reactive diluent to reduce the viscousity of the resulting source solution,
1.2 grams of General Electric Octacat ®, and
6ppm of copper napthanate.

This source solution had a low viscosity suitable for spraying or spin coating to form thin layers.

This material was both spin coated and spray coated on substrates (on different occassions), baked at 125° C. for 20 minutes, at 150° C. for 10 minutes after which it had a hardness >3H and exhibited desirable properties for use in the HDI structure.

Each of the dielectric layers in these examples exhibits a mixture of properties of polyimides and epoxies. Particularly significant is the fact that this epoxy/polyimide copolymer blend material exhibits the desirable properties of both source materials. In particular, these layers are more flexible than pure epoxy layers, are less brittle than pure epoxy layers, are less flexible than pure polyimide layers and are truly thermoset materials in that they are stable at temperatures in excess of 200° C., despite their formation and curing at temperatures at or below 150° C. and the fact that the epoxy component by itself is not stable at 200° C. Further, this epoxy/polyimide copolymer blend material cures quickly at low temperatures which do not endanger any of the integrated circuits or other components of the multilayer structure. As discussed above, good interlayer adhesion is present in accordance with the polyimide/epoxy solids ratio and baking conditions employed.

Structures of this type were exposed to extreme thermal shocks by first heating them on a hot plate to 150° C., then immediately immersing them in liquid nitrogen (at 77° Kelvin) and then returning them to the hot plate. Samples which were exposed to more than 1,000 cycles of this severe temperature shock exhibited no crazing. cracking or other apparent deleterious effects. This epoxy/polyimide copolymer blend is desirable as a dielectric layer in a multilayer structure because it is very effective at providing a planar surface, even when disposed in a 25 micron thick layer over a pattern of 5-6 microns thick metal conductors. This provides a surface which faciliatates the formation and patterning of subsequent metalization layers and the application of subsequent dielectric layers in a multilayer structure as well as providing high dielectric isolation. Further, this material is resistant to damage from plasma etching, sputtering of the metal layers and other HDI process steps which adversely effect some dielectric materials. Thus, this invention provides a very effective, easily processed dielectric material which is highly suitable for use in multilayer structures of many types and in particular in printed circuit boards and in the GE HDI structure.

This epoxy/polyimide copolymer blend material is suitable for many other uses, including as dielectric overlayers and intermediate layers in multilayer structures, whether or not they are intended for use in electronic systems. This material is also suitable, especially in its solventless source solution form for use as the binding material in the central, normally rigid, glass layer/impregnant portion of a printed circuit board in place of the prior art epoxy. This is particularly advantageous because of its stability to higher temperatures than plain epoxy.

The epoxy/polyimide copolymer blend material is effectively a plasticized epoxy in which the siloxane ployimide serves as the plasticizer in place of the commonly used polyol plasticizers.

epxoy/polyimide solids ratios from 5% to 70% are useful, while ratios between 26% and 46% are preferred. The solids ratio has an effect the manner of layering which is most beneficial in differing situations.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multilayer structure comprising:
   a first epoxy/polyimide copolymer blend dielectric layer;
   a patterned metal layer overlying said dielectric layer; and
   a second epoxy/polyimide copolymer blend dielectric layer over said patterned metal layer.

2. The multilayer structure recited in claim 1 wherein:
   said second epoxy/polyimide copolymer blend dielectric layer is disposed on said first epoxy/polyimide copolymer blend dielectric layer and said patterned metal layer.

3. The multilayer structure recited in claim 1 further comprising:
   a thermoplastic layer disposed on said first epoxy/polyimide copolymer blend dielectric layer and said patterned metal layer.

4. The multilayer structure recited in claim 3 wherein:
   said second epoxy/polyimide copolymer blend dielectric layer is disposed on said thermoplastic layer.

* * * * *